United States Patent [19]
Bhandari et al.

[11] Patent Number: 5,596,674
[45] Date of Patent: Jan. 21, 1997

[54] STATE MACHINE APPARATUS AND METHODS FOR ENCODING DATA IN SERIAL FORM AND DECODING USING MULTIPLE TABLES

[75] Inventors: Rajan Bhandari; Clive H. Gillard, both of Basingstoke, United Kingdom

[73] Assignees: Sony Corporation, Tokyo, Japan; Sony United Kingdom Limited, Weybridge, United Kingdom

[21] Appl. No.: 67,117

[22] Filed: May 26, 1993

[30] Foreign Application Priority Data

Jun. 24, 1992 [GB] United Kingdom .................. 9213426

[51] Int. Cl.$^6$ ................................ G10L 3/02; G10L 9/00
[52] U.S. Cl. ................................. 395/2.1; 341/65; 341/67; 358/426
[58] Field of Search ............................... 395/2, 2.1, 2.65, 395/2.64; 358/539, 427, 261.3, 426; 341/65, 67, 106; 381/34; 382/56

[56] References Cited

U.S. PATENT DOCUMENTS

| | | | |
|---|---|---|---|
| 4,099,257 | 7/1978 | Arnold et al. | 364/900 |
| 5,253,078 | 10/1993 | Balanski et al. | 358/426 |
| 5,392,038 | 2/1995 | Bhandari et al. | 341/67 |
| 5,414,526 | 5/1995 | Friedman | 358/426 |

FOREIGN PATENT DOCUMENTS

| | | | |
|---|---|---|---|
| 0279799 | 8/1988 | European Pat. Off. | H03M 7/42 |
| 0286719 | 10/1988 | European Pat. Off. | H03M 7/42 |
| 0396368 | 11/1990 | European Pat. Off. | H04N 1/38 |
| 467678A2 | 7/1991 | European Pat. Off. | H03M 7/42 |
| 0467678 | 1/1992 | European Pat. Off. | H03M 7/42 |

OTHER PUBLICATIONS

An Encoding Procedure and a Decoding Procedure for a New Modified Huffman Code Lu et al., IEEE/Jan. 1990.
Design and Hardware Implementation of a Memory Efficient Huffman Decoding Hashemian, IEEE/Jun. 1990.
IEEE International Conference on Computer Design: VLSI in Computers and Processors vol. 6, Oct. 1989, New York (US) pp. 172–175 Lin et al 'high throughput reconstruction of huffman coded images'.

Patent Abstracts of Japan, Publication No. JP 4037270, Publication Date Feb. 7, 1992, Abstract Publication May 22, 1992, Manabe Katsuhiko Int. Cl. :H04N5/278; H04N5/262, Title: Digital Teleconverter.

*Primary Examiner*—Allen R. MacDonald
*Assistant Examiner*—Richemond Dorvil
*Attorney, Agent, or Firm*—William S. Frommer; Alvin Sinderbrand

[57] ABSTRACT

A serial data coding system is described in which a state machine (FIG. 5) is provided having a plurality of branching hierarchies N, N+1 of states each corresponding to a different decoding table. Depending upon each received bit of serial data, the state machine moves through these branching hierarchies of states until states 88 corresponding to valid codes are reached whereupon a valid code is decoded and the state machine reset to the start of that branching hierarchy. If it is desired to move between branching hierarchies, then an internal table selecting word is inserted into the stream of serial data to move the state machine into a table incrementing state 90 where a jump to another branching hierarchy of states may be made. In order to cope with an externally applied switching signal Y/C for switching the state machine between branching hierarchies, the state machine is first moved into one of a plurality of transfer states A, C, D etc. These states are chosen to be distinct from all other states of the state machine within any branching hierarchies so there is no ambiguity as to which state should be adopted after receipt of the externally applied switching signal Y/C.

22 Claims, 5 Drawing Sheets

Next State Address

STATE MACHINE APPARATUS AND METHODS FOR ENCODING DATA IN SERIAL FORM AND DECODING USING MULTIPLE TABLES

BACKGROUND OF THE INVENTION

1. Field of the Invention

This invention relates to the field of serial data decoding. More particularly, this invention relates to the field of serial data decoding utilising state machines.

2. Description of the Prior Art

It is known to provide image data compression systems that generate a serial data stream of compressed and encoded data for transmission or recording prior to subsequent decoding and decompression. An example of such a system is that proposed by the Joint Photographic Experts Group (JPEG). In order to increase compression efficiency in such systems, it has been proposed to use a plurality of coding tables each matched to a particular part of the data to be compressed. A coding table that is effective for data containing long runs of zero values is unlikely to be well suited to the coding of data in which runs of zero values are uncommon. The use of a plurality of coding tables allows each coding table to be better suited to exploiting the characteristics of the type of data it is being used to encode.

The JPEG system was conceived as a still image compression system primarily intended for non-real time use with general purpose computers. In such general purpose computers, the task of using a plurality of differing coding tables can be achieved in a relatively straight forward fashion with appropriate software. However, if it is desired to produce a real time system for compressing and decompressing a sequence of images at a rate of perhaps 50 per second, then it is difficult for a general purpose computer operating under software control to cope with the necessary data processing load.

In order to increase processing speed, dedicated hardware may be used to achieve higher speed operation. Such a system may incorporate several different processing stages such as decorrelation, quantisation, run length coding and Huffman coding. One significant part of such a system is serial data encoding and decoding. One way of implementing serial data decoding is to use a state machine in which each received bit of data controls the next state into which the state machine passes until a state corresponding to a valid code is reached whereupon the valid code may be outputted and the state machine reset. Whilst such state machine implementations can provide high speed operation, it is difficult to accommodate the use of a plurality of decoding tables.

SUMMARY OF THE INVENTION

This invention provides a serial data decoder for generating output data words according to a selectable one of a plurality of decoding tables, said serial data decoder comprising a state machine responsive to received bits of serial data so as to move between states within a selectable one of a plurality of branching hierarchies of states, each branching hierarchy corresponding to one of said plurality of decoding tables and being such that each bit of said serial data controls which succeeding state is adopted until a state corresponding to a valid data word is reached, and wherein at least one of said plurality of branching hierarchies includes a state corresponding to a complete internal table selecting word that is operative to select a predetermined different branching hierarchy and corresponding decoding table for subsequent use from among said plurality of branching hierarchies.

It will be seen that the incorporation within the state machine of a plurality of branching hierarchies of states allows the state machine to support the use of more than one coding table. Each of the branching hierarchies is configured to carry out decoding according to a different coding table. The problem of controlling the switching between branching hierarchies/coding tables at appropriate times is met by the incorporation of a state corresponding to an internal table selecting word within at least one of the branching hierarchies (in most cases the internal table selecting word state will be included within all branching hierarchies from which it is desired to be able to switch to another branching hierarchy). This allows a switch to be made out of that branching hierarchy to another branching hierarchy corresponding to another coding table upon receipt of an internal table selecting word inserted within the stream of serial data. In this way a high speed state machine decoder capable of dealing with a plurality of different decoding tables is provided.

The invention is particularly suited to situations in which said plurality of decoding tables are a plurality of Huffman decoding tables.

Huffman coding tables are predefined to the system and so are suited to being fixed within a state machine implementation. Furthermore, Huffman codes are variable length codes that can pose considerable difficulties in decoding in ways other than using a state machine.

Although the invention could be used in a number of different fields, such as audio data processing, the invention is particularly suited for use in embodiments in which said received bits of serial data represent two dimensional sub band components of an image in the spatial frequency domain, differing sets of sub band components being decoded with differing decoding tables.

Image data processing is a field with particularly stringent requirements and within which considerable advantage may be taken of data encoding techniques. In the case of image data that has been transformed into sub band components in the two-dimensional spatial frequency domain, the characteristics of the sub band components vary greatly and the ability to use a plurality of coding tables is strongly advantageous.

It will be appreciated that when implementing a state machine for decoding serial data there can be large numbers of codes that must be handled. In the case of a coding table for handling the "DC" sub band component of a broadcast quality image, the number of valid codes in the coding table alone may be in excess of 2000. A preferred way of dealing with such large numbers of states is that said state machine includes a memory with address locations within said memory corresponding to states of said state machine and for storing data for controlling the next address location to be read and state entered.

The use of a memory storing data for controlling the transitions within the state machine allows the implementation of such a large state machine to be made easier. Computer programs may be written to generate and check the necessary data to be stored within the memory and changes to the state machine can be made merely by changing the data stored.

A direct and efficient way of using the received bits of serial data to control state machine transitions is provided by embodiments in which the next received bit of serial data is combined with data from a currently read address location to derive the next address location to be read.

Whilst each of the branching hierarchies and associated decoding tables may be very different in the way in which the sequence of states to be adopted are arranged, by contrast, the sequence in which the coding tables should be applied to the serial data stream may be a predetermined sequence. In preferred embodiments of the invention said state machine includes a current decoding table counter for storing a table count value indicating which branching hierarchy and corresponding decoding table are to be used, said table selecting word being operative to increment said table count value.

This feature means that a single internal table selecting word is all that is required to perform all of the table switches since the additional information identifying which specific decoding table is to be used is provided independently of the stream of serial data by the table count value. In an analogous way to the above described control of movement between states, in a preferred embodiment of the invention said table count value is combined with data from said currently read address location to derive the next address location to be read.

In some embodiments of the invention it may also be desirable to allow for a switching of decoding table to be made in response to an externally applied signal. For example, in the case of a serial data stream containing interleaved different types of data (e.g. luminance and chrominance data), the coding table to be used may be switched within each type of data by the internal table selecting words and switched between each type of data by the externally applied switching signal. Accordingly, in preferred embodiments of the invention said state machine receives an externally applied switching signal which is combined with data from said currently read address location to derive the next address location to be read, a change in said switching signal being operative to select a different branching hierarchy and corresponding decoding table for subsequent use from among said plurality of branching hierarchies.

A complementary aspect of this invention is a serial data encoder generating a stream of serial data from input data words, said serial data encoder comprising:

(i) means for applying a selectable one of a plurality of encoding tables to said input data words; and (ii) means for inserting internal table selecting words into said stream of serial data upon a change in selected encoding table so as to control selection of a complementary decoding table during decoding of said serial data.

Viewed from another aspect the invention provides a method of serial data decoding for generating output data words according to a selectable one of a plurality of decoding tables, said method comprising the steps of:

(i) moving a state machine in response to received bits of serial data between states within a selectable one of a plurality of branching hierarchies of states, each branching hierarchy corresponding to one of said plurality of decoding tables and being such that each bit of said serial data controls which succeeding state is adopted until a state corresponding to a valid data word is reached; and (ii) selecting a different branching hierarchy and corresponding decoding table for subsequent use from among said plurality of branching hierarchies in response to a state corresponding to an internal table selecting word.

In embodiments of a serial data decoder incorporating a state machine and using which is it desired to decode data having a plurality of interleaved data sections (e.g. luminance and chrominance), an externally applied switching signal can be used to change the decoding table in use between data sections. A problem that arises in this case is that no ambiguity should arise between a state in a current branching hierarchy and a state in a target branching hierarchy between which it is desired to switch. If this were not the case, then following receipt of an externally applied switching signal, the state machine would be unable to distinguish whether it had adopted a particular state within the target branching hierarchy through the correct decoding of a number of bits of serial data or that the state had been arrived at due to a carrying over of conditions from the previous branching hierarchy. One way of dealing with this problem would be to make each state of the state machine corresponding to a valid code within a current branching hierarchy distinct from any state within a target branching hierarchy to which a switch is possible. Whilst this would avoid the problem of ambiguity, it would disadvantageously increase the complexity of the state machine. In the case of a state machine using a plurality of coding tables each with in excess of a 1000 valid codes, the requirement to ensure that all possible states before and after such a switch were distinct would mean that a greater number of state variables would need to be supported, with a corresponding increase in hardware requirements, and the task of assigning the states within the branching hierarchies would be made more difficult due to the interdependence of the branching hierarchies.

This invention provides a serial data decoder for generating output data words according to a selectable one of a plurality of decoding tables from a stream of input data having a plurality of data sections to be decoded with differing decoding tables, said serial data decoder comprising a state machine responsive to received bits of serial data so as to move between states within a selectable one of a plurality of branching hierarchies of states, each branching hierarchy corresponding to one of said decoding tables and being such that each bit of said serial data controls which succeeding state is adopted until a state corresponding to an output data word is reached, and wherein at least one of said branching hierarchies includes one or more transfer states into which said state machine moves after having received one of said data sections and before switching from a current branching hierarchy to a target branching hierarchy in response to an externally applied switching signal, said one or more transfer states being distinct from any states corresponding to an output data word and all possible states within said target branching hierarchy.

The modification of the branching hierarchies to include specific transfer states into which the state machine is moved prior to application of the externally applied switching signal has the effect that only the transfer states need be distinct from states within the target branching hierarchy. It will be appreciated that since the transfer states are specifically added to the branching hierarchy so that appropriate bits within the serial data can move the state machine into these transfer states, the transfer states should not correspond to any output data word within the current branching hierarchy. Upon encoding of the serial data stream, at the end of each data section from which such a switch is desired, appropriate bits are inserted to ensure that the state machine will be in one of the transfer states before the externally applied switching signal is applied. In this way, the size and complexity of the state machine is reduced and the task of assigning the states within the branching hierarchies made easier.

In preferred embodiments of the invention said transfer states are states corresponding to partial and full receipt of said internal table selecting word.

In this way a single code can be made to perform more than one control task so reducing the effect of the provision of these extra codes upon coding efficiency.

Implementation of the invention is made easier in embodiments of the invention in which said state machine moves into one or more transfer states at the end of each data section to bring said data section up to a predetermined size.

In this way data sections can be made to finish on byte boundaries and the complications of dealing with slight size variations in this size of data sections reduced.

The preferred features discussed above in relation to the first aspect of this invention are also applicable to this aspect of the invention involving the provision of transfer states.

A further complementary aspect of the invention is a serial data encoder for generating a stream of serial data from input data words having a plurality of data sections, said serial data encoder comprising:

(i) means for applying a selectable one of a plurality of encoding tables to said input data words;

(ii) means for switching encoding table between differing data sections; and (iii) means for inserting a sequence of bits of data into said stream of data between encoded versions of said data sections for moving a state machine decoder during decoding of said serial data into one or more unique transfer states prior to a complementary switching of decoding table.

Viewed from another aspect the invention provides a method of serial data decoding for generating output data words according to a selectable one of a plurality of decoding tables from a stream of input data having a plurality of data sections to be decoded with differing decoding tables, said method comprising the steps of:

(i) moving a state machine in response to received bits of serial data between states within a selectable one of a plurality of branching hierarchies of states, each branching hierarchy corresponding to one said decoding tables and being such that each bit of said serial data controls which succeeding state is adopted until a state corresponding to an output data word is reached;

(ii) moving said state machine into one or more transfer states after having received one of said data sections; and (iii) switching from a current branching hierarchy to a target branching hierarchy in response to an externally applied switching signal, said one or more transfer states being distinct from any states corresponding to an output data word and all possible states within said target branching hierarchy.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
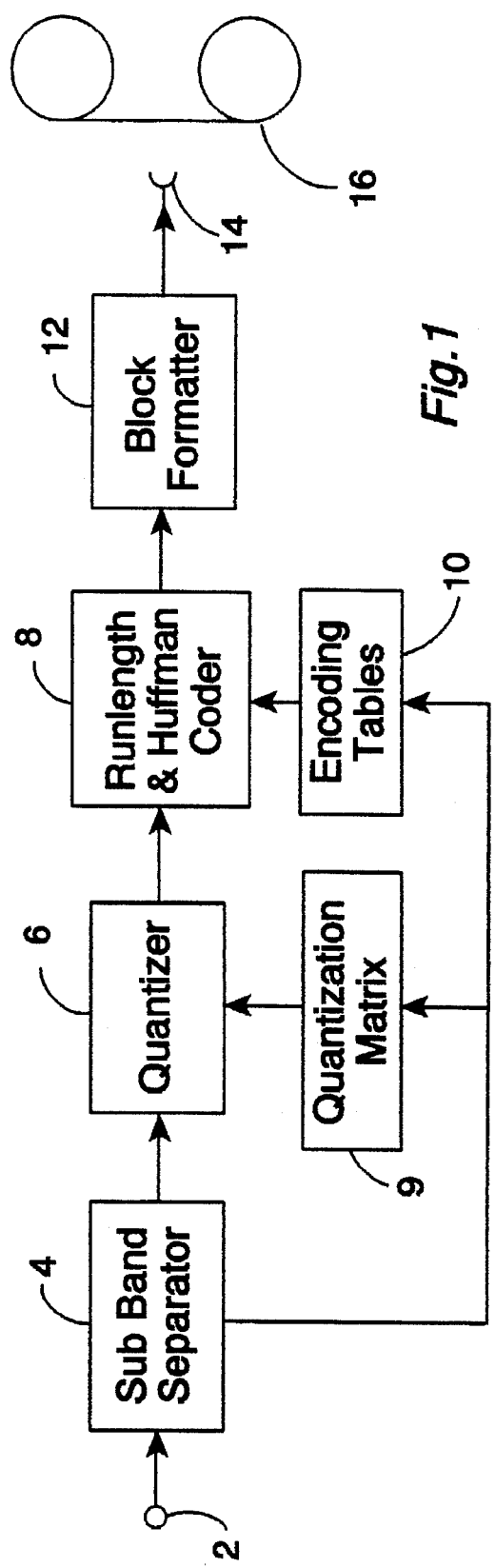
FIG. 1 illustrates an apparatus for compressing and recording image data.

FIG. 1 shows an image data compressing and recording apparatus. Image data is input at input node 2 and passed to a sub band separator 4. The sub band separator 4 includes banks of horizontal and vertical finite impulse response filters that serve to split and decimate the data into sub band components in the two dimensional spatial frequency domain (i.e. sub band transformation). Transformed data is then passed to a quantizer 6 where it is subject to a lossy quantization operation under control of data stored within a quantization matrix 9. The data output from the quantizer 6 is passed to a runlength and Huffman coder 8. The runlength and Huffman coder 8 applies one of a plurality coding tables 10 to the data depending upon which sub band component the data originates from. The runlength and Huffman coder 8 exploits correlation within the data to effect compression. The output from the runlength and Huffman coder 8 is passed to a block formatter 12 which splits the data into a sequence of blocks of data in a serial data stream. This serial data stream is recorded via recording head 14 onto magnetic tape 16. Each block of data includes a header indicating the nature of the data contained in that block.

The sub band separator 4 outputs a signal indicative of which sub band component is currently being passed to the quantizer 6 and the runlength and Huffman coder 8. This signal is supplied to the quantization matrix 9 and the encoding tables 10 to select the degree of quantization and which encoding table are to be applied to that sub band component.

Figure 2:
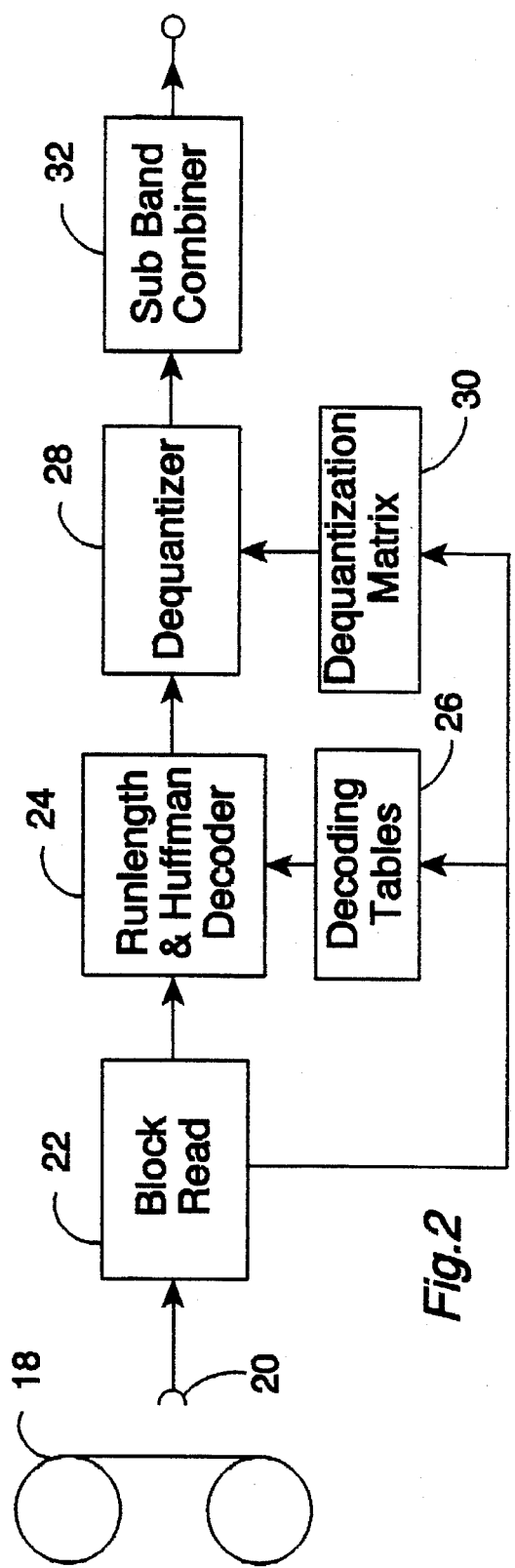
FIG. 2 illustrates an apparatus for reproducing and decompressing image data.

FIG. 2 illustrates a reproducing and decompressing apparatus. A stream of serial data is read from a magnetic tape 18 by a read head 20 into a block read unit 22. The serial data is in the format of the sequence of blocks each including a header as described above. The block read unit 22 reads the header information and passes the serial data onto a runlength and Huffman decoder 24. The runlength and Huffman decoder 24 applies a selected decoding table 26 to the data and passes its output to a dequantizer 28. The dequantizer 28 applies a selected dequantization value from a dequantization matrix 30 to the data. The dequantized data is passed to a sub band combiner 32 where a bank of horizontal and vertical interpolating finite impulse response filters transform the data from the sub band domain to the spatial domain. The decoded, de-quantized and transformed data is then fed to output node 34.

The block read unit 22 extracts from the header of each block data indicating which sub band component the data within the block represents and uses this to select which of the decoding tables 26 is applied and what dequantization value is selected from the dequantization matrix at 30.

Figure 3:
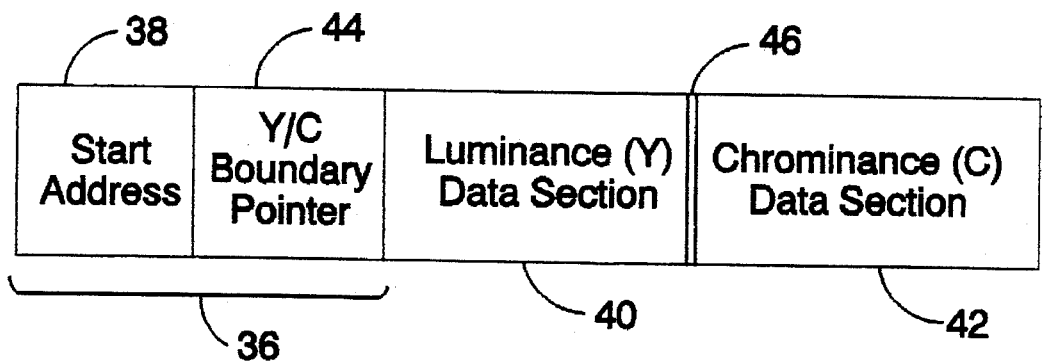
FIG. 3 illustrates a data block from within a serial data stream.

FIG. 3 illustrates a data block of the format used in the serial data stream recorded on the magnetic tape 16, 18. A header 36 includes a start address 38 indicating the start position of the luminance data section 40 and the chrominance data section 42 within the transformed image. A Y/C boundary pointer 44 within the header 36 gives the position 46 within the block at which the luminance data section 40 changes to the chrominance data section 42. The position 46 varies in dependence upon the relative degree of compression achieved for the luminance data and the chrominance data for a given section of the transformed image. Each block contains luminance data and chrominance data from the same section of the transformed image so as to facilitate the production of at least some form of image during shuttle replay in which only a fraction of the blocks of data are correctly read.

Figure 4:
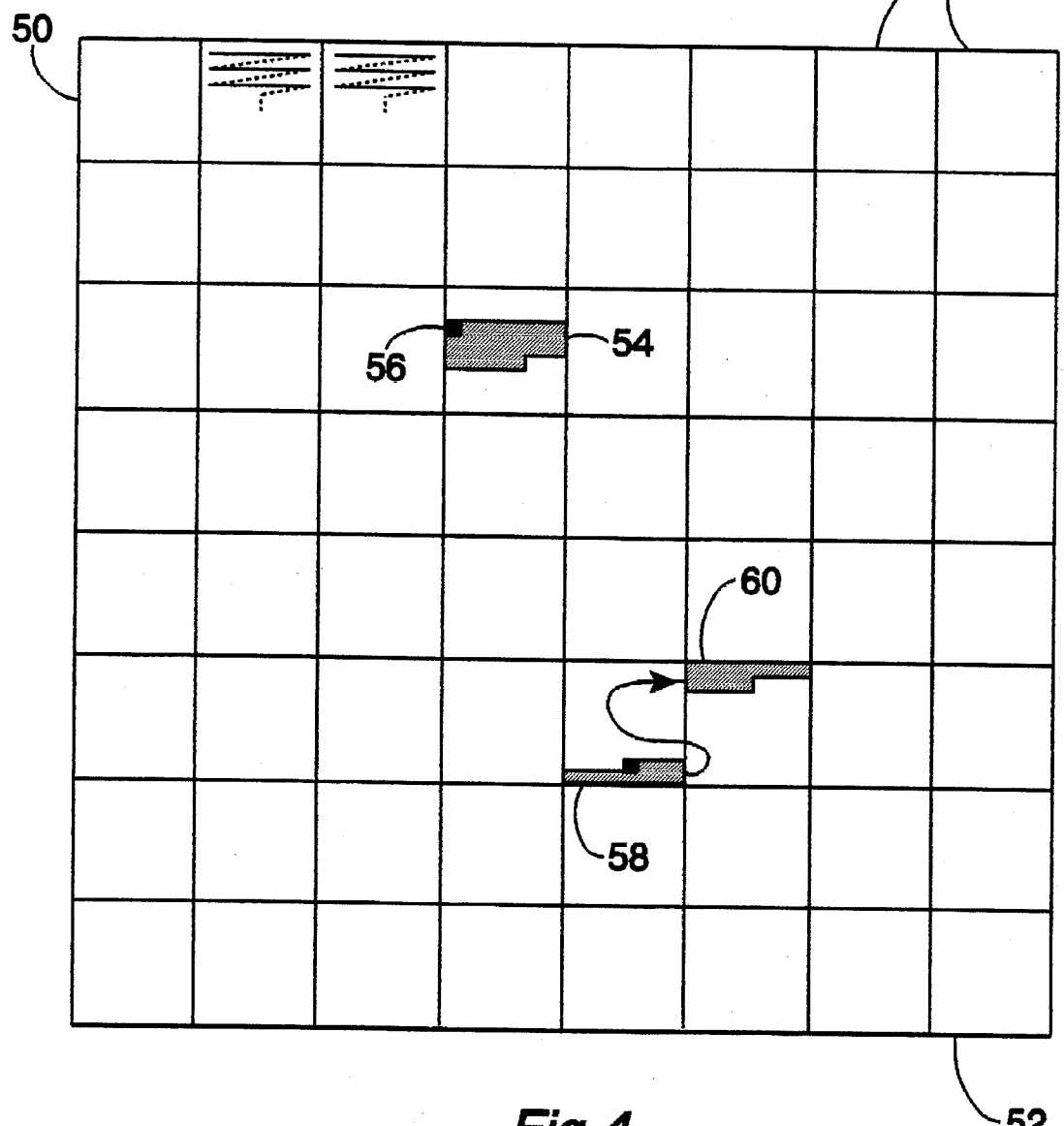
FIG. 4 illustrates the relationship between a data block of the type illustrated in FIG. 3 and position within an array of sub band components.

FIG. 4 illustrates an 8*8 array of two dimensional sub band spatial frequency components. Each sub band component 48 contains an array of sub band component data values. In a typical image, the information content is mainly in the lower spatial frequencies. The lowest spatial frequency sub band component 50 (the "DC" sub band) will have different characteristics to the highest frequency sub band component 52. Each of the sub band components 48 is subject to quantization with a matched quantization value selected from a quantization matrix and encoded with a matched coding table. The data within each sub band component 48 is raster scanned to form a serial data stream that is then subject to quantization and encoding. When the end of one sub band has been reached, the next sub band is raster scanned.

The finite size of the blocks of data illustrated in FIG. 3 has the effect that each particular block corresponds to particular section of the transformed image such as section 54. The start address 38 specifies the start position 56 of the section 54 within the transformed image.

Some data blocks will correspond to a section of the transformed image with a part 58 in one sub band and a part 60 in another sub band. In the case that these two sub bands require different coding tables, a switch of coding table is required part way through the encoding of the block in question and part way through the decoding of the block in question.

FIG. 4 illustrates the data comprising one of the luminance and chrominance data for an image. It will be understood that an analogous arrangement of sub band components, scanning patterns and relationships of data blocks to positions within sub bands will exist for the data representing the other of the luminance and chrominance components.

Figure 5:
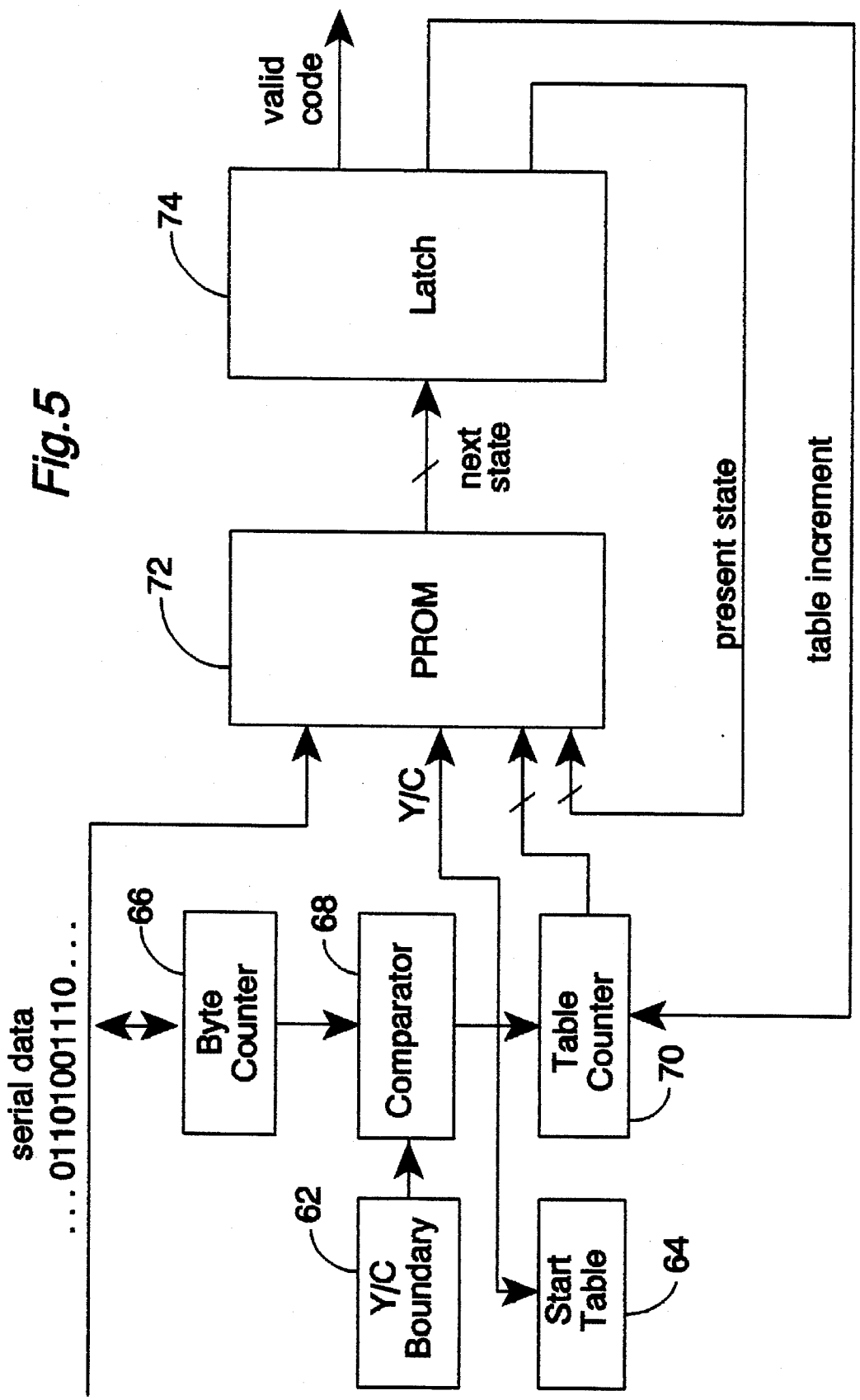
FIG. 5 illustrates a state machine serial data decoder.

FIG. 5 illustrates a state machine decoder. The Y/C boundary pointer 44 from the header 36 of each block is loaded into a Y/C boundary memory 62 by the block read unit 22 at the start of each data block. The start address 38 from the header 36 is decoded to give an indication of which coding table should be used at the start of the luminance data section 40 and chrominance data section 42 of the data block in question. This starting table is stored within a start table memory 64. As the serial data from the data block in question is received, a byte counter 66 counts the number of bytes received. A comparator 68 compares the number of bytes received with the Y/C boundary pointer to determine if the point 46 has been reached. When the point 46 is reached, a switching signal Y/C is generated.

At the start of each data block, the starting table value stored in the start table memory 64 is loaded into a table counter 70 and in addition, when the comparator 68 generates a switching signal Y/C, this is fed to the table counter 70 and the start table memory 64 to reload the table counter 70 with the initial starting table value.

A programmable read only memory (PROM) 72 is addressed with a address value formed from a concatenation of a fed back present state value, a table count value from table counter 70, the switching signal Y/C and the next received bit of the serial data to be decoded. This concatenated address value acts to access a specific memory location within the PROM 72 and feed the contents of this memory location to a latch 74 where it is stored.

One bit of the latched value indicates whether or not a state corresponding to a valid code has been reached. Another bit of the latched value indicates whether an internal table selecting word has been received and if so feeds this back to the table counter 70 so as to increment the table count value stored therein. The remainder of the latched bits are fed back to the PROM 72 as present state values controlling the next memory location to be read and corresponding state to be entered. When a valid code is indicated, the present state value is read out as an index value to be mapped elsewhere to the actual value of the valid code.

Figure 6:
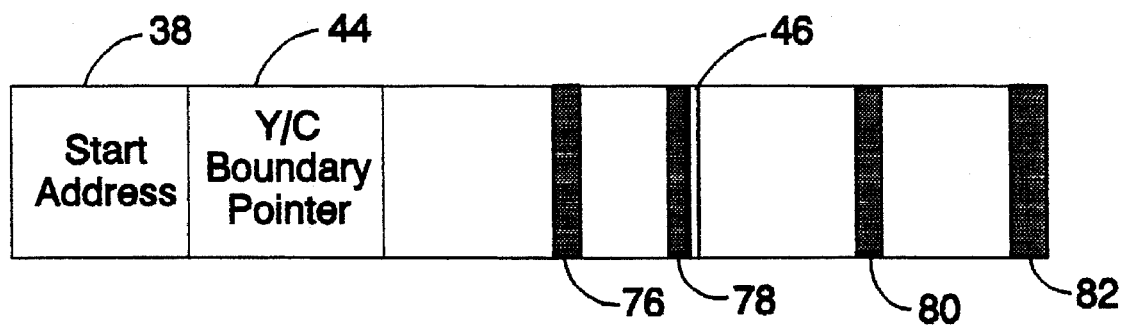
FIG. 6 illustrates the occurrence of special control code words within a data block of the type illustrated in FIG. 3.

FIG. 6 illustrates a data block including various special code words 76, 78, 80 and 82. The special code words 76 and 80 are internal table selecting words. When the state machine of FIG. 5 enters a state indicating the completed reception of such an internal table selecting word, then the table increment flag is raised serving to increment the table count value stored in the table counter 70. The internal table selecting word is chosen to be a run of 1s of a predetermined length. This has the advantage that this code will be the lowest probability Huffman code and so should not severely impact the Huffman coding efficiency. Furthermore, since this word has no phase content, the full or partial insertion of the word into the serial data stream is made easier.

At the end of the luminance data section 40, and immediately prior to the point 46, a further special code 78 is inserted to place the state machine into transfer states that are distinct from all possible states that the state machine may adopt during decoding using any other decoding table and to bring the luminance data section 40 up to a byte boundary. Even if the luminance data section 40 without the special code 78 would finish on a byte boundary, a special code 78 is nevertheless inserted so as to make possible an unambiguous inter-component transfer. The asserting of the switching signal Y/C at point 46 after the state machine has adopted the transfer states serves to reset the state machine to the top of the branching hierarchy corresponding to the chrominance decoding table indicated by the contents of the start table memory 64. Since the system is reset after receipt of the special code 78 before any further data is decoded, in practice the same special code of a sequence of 1s can be used here as for the internal table selecting word.

The "present state" values for each of the partially decoded and fully decoded states of the internal table selecting words within each of the branching hierarchies are unique. In this way, these states can serve as the transfer states from which table switches can be made without the risk of any ambiguity as to which state the state machine is in.

At the end of the chrominance data section 42 is a filler word 82 that serves to bring the data block up to its predetermined size. Again, since the state machine will be reset before decoding any further data, the filler word 82 can be a sequence of all 1s. It will be appreciated that the special code words 78 and 82 will not be of fixed length and will respectively have the length necessary to bring the luminance data section up to a byte boundary and that necessary to completely fill the chrominance data section. In the case of the filler word 82, the filler may correspond to several complete internal table selecting words and accordingly will cycle the table count value through several increments. This does not matter since the system will be reset before any further decoding takes place.

Figure 7:
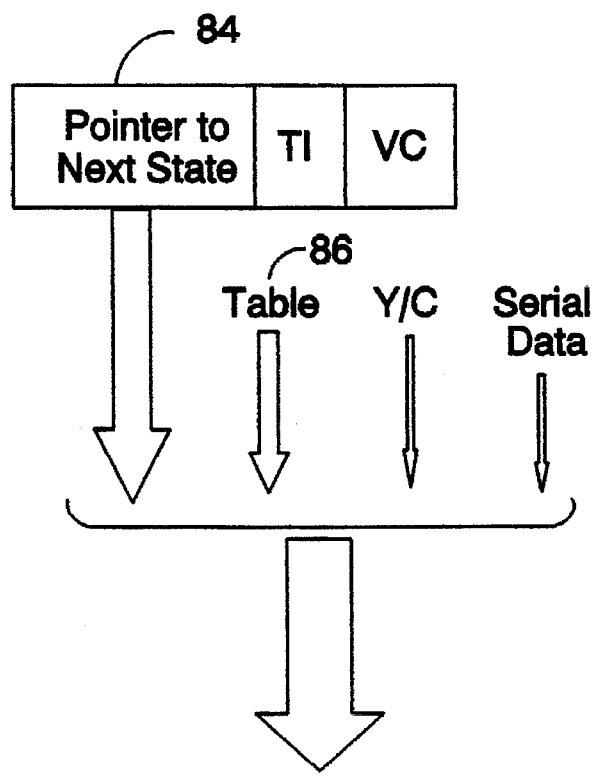
FIG. 7 illustrates the data used to control the movement between states of the state machine illustrated in FIG. 5.

FIG. 7 illustrates the control data stored within the memory locations of the PROM 72. Each memory location stores a pointer to the next state 84 and bits indicating whether the table count value should be incremented TI and that a state corresponding to a valid code has been reached VC. The pointer to the next state 84 is concatenated with the table count value 86, the switching signal Y/C and the serial data to produce the next state address supplied on what can be considered as a composite read address bus to the PROM 72.

Figure 8:
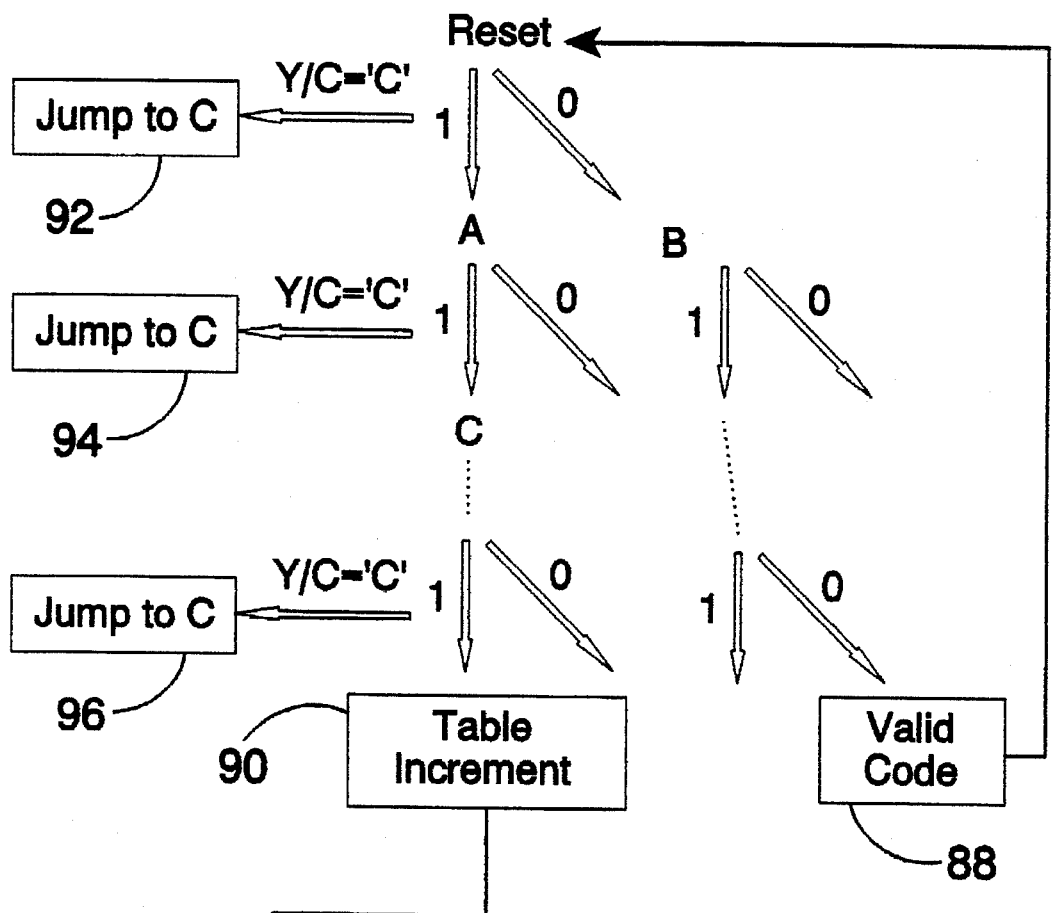
FIG. 8 schematically illustrates two branching hierarchies of states and possible movements from these hierarchies.

FIG. 8 schematically illustrates two branching hierarchies corresponding respectively to coding tables N and N+1. From the reset state at the start of each of the tables, the state machine branches to one of either of two states A or B depending upon whether a serial data bit of 1 or 0 is received. Decoding proceeds down the branching hierarchy until a state such as state 88 is reached corresponding to a valid code. At this point, the present state value is read as an index to the code value and the state machine returns to the reset state.

In the case of the receipt of a succession of 1s the state machine proceeds through a sequence of transfer states A, C etc. to a state 90 corresponding to receipt of the internal table selecting word whereupon the table count value is incremented. Each of these states A, C, etc. is distinct from any other state of the state machine such that if the externally applied switching signal Y/C is activated then an unambiguous jump to the first of the chrominance decoding tables may be made as illustrated by states 92, 94 and 96.

When the state 90 is reached corresponding to receipt of the complete special code word then the state machine progresses to either state D or state E upon the next cycle depending upon whether a 1 or 0 is received. If the serial data stream is at the end of the chrominance data section 42 and the bits of data being received are a filler word, then several tables may in fact be moved through prior to reaching the end of the data block.

Although illustrative embodiments of the invention have been described in detail herein with reference to the accompanying drawings, it is to be understood that the invention is not limited to those precise embodiments, and that various changes and modifications can be effected theerin by one skilled in the art without departing from the scope and spirit of the invention as defined by the appended claims.

We claim:

1. A serial data decoder for generating output data words according to a selectable one of a plurality of decoding tables, said serial data decoder comprising a state machine responsive to received bits of serial data so as to move between states within a selectable one of a plurality of branching hierarchies of states, each branching hierarchy corresponding to one of said plurality of decoding tables and being such that each bit of said serial data controls which succeeding state is selected until a state corresponding to a valid data word is reached, and wherein at least one of said plurality of branching hierarchies includes a state corresponding to a complete internal table selecting word for selecting a predetermined different branching hierarchy and corresponding decoding table for subsequent use from among said plurality of branching hierarchies.

2. A serial data decoder as claimed in claim 1, wherein said plurality of decoding tables are a plurality of Huffman decoding tables.

3. A serial data decoder as claimed in claim 1, wherein said state machine includes a memory with address locations within said memory corresponding to states of said state machine and for storing data for controlling the next address location to be read and state entered.

4. A serial data decoder as claimed in claim 3, wherein the next received bit of serial data is combined with data from a currently read address location to derive the next address location to be read.

5. A serial data decoder as claimed in claim 4, wherein said state machine includes a current decoding table counter for storing a table count value indicating which branching hierarchy and corresponding decoding table are to be used and for incrementing said table count value in response to said internal table selecting word, said table count value being combined with data from said currently read address location to derive the next address location to be read.

6. A serial data decoder as claimed in claim 4, wherein said state machine receives an externally applied switching signal which is combined with data from said currently read address location to derive the next address location to be read, said state machine serving to respond to a change in said switching signal for selecting a different branching hierarchy and corresponding decoding table for subsequent use from among said plurality of branching hierarchies.

7. A serial data decoder for generating output data words according to a selectable one of a plurality of decoding tables, said serial data decoder comprising a state machine responsive to received bits of serial data representing two dimensional sub band components of an image in the spatial frequency domain, so as to move between states within a selectable one of a plurality of branching hierarchies of states, each branching hierarchy corresponding to one of said plurality of decoding tables and being such that each bit of said serial data controls which succeeding state is selected until a state corresponding to a valid data word is reached, the state machine serving to decode differing sets of sub band components with differing, respective decoding tables, and wherein at least one of said plurality of branching hierarchies includes a state corresponding to a complete internal table selecting word for selecting a predetermined different branching hierarchy and corresponding decoding table for subsequent use from among said plurality of branching hierarchies.

8. A serial data decoder for generating output data words according to a selectable one of a plurality of decoding tables, said serial data decoder comprising a state machine responsive to received bits of serial data so as to move between states within a selectable one of a plurality of branching hierarchies of states, each branching hierarchy corresponding to one of said plurality of decoding tables and being such that each bit of serial data controls which succeeding state is selected until a state corresponding to a valid data word is reached, and wherein at least one said plurality of branching hierarchies includes a state corresponding to a complete internal table selecting word for selecting a predetermined different branching hierarchy and corresponding decoding table for subsequent use from among said plurality of branching hierarchies, said state machine including a current decoding table counter for storing a table count value indicating which branching hierarchy and corresponding decoding table are to be used, said current decoding table counter being responsive to the internal table selecting word to increment said table count value.

9. A serial data encoder generating a stream of encoded serial data from input data words, said serial data encoder comprising:
 (i) means for applying a selectable one of a plurality of encoding tables to said input data words to produce corresponding encoded serial data; and
 (ii) means for inserting an internal table selecting word into said corresponding encoded serial data upon a change in selected encoding table to produce the stream of encoded serial data, the internal data selecting word serving to control selection of a complementary decoding table during decoding of said stream of encoded serial data.

10. A method of serial data decoding for generating output data words according to a selectable one of a plurality of decoding tables, said method comprising the steps of:
 (i) moving a state machine in response to received bits of serial data between states within a selectable one of a plurality of branching hierarchies of states, each branching hierarchy corresponding to one of said plurality of decoding tables and being such that each bit of said serial data controls which succeeding state is selected until a state corresponding to a valid data word is reached; and
 (ii) selecting a different branching hierarchy and corresponding decoding table for subsequent use from among said plurality of branching hierarchies by switching to a table selecting state within one of the plurality of branching hierarchies of states corresponding to an internal table selecting word with the received bits of serial data.

11. A serial data decoder for generating output data words according to a selectable one of a plurality of decoding tables from a stream of input data having a plurality of data sections to be decoded with differing decoding tables, said serial data decoder comprising a state machine responsive to received bits of serial data so as to move between states within a selectable one of a plurality of branching hierarchies of states, each branching hierarchy corresponding to one of said decoding tables and being such that each bit of said serial data controls which succeeding state is selected until a state corresponding to an output data word is reached, and wherein at least one of said branching hierarchies includes one or more transfer states into which said state machine moves after having received one of said data sections and before switching from a current branching hierarchy to a target branching hierarchy in response to an externally applied switching signal, said one or more transfer states being distinct from any states corresponding to an output data word and all possible states within said target branching hierarchy.

12. A serial data decoder as claimed in claim 11, wherein said plurality of decoding tables are a plurality of Huffman decoding tables.

13. A serial data decoder as claimed in claim 11, wherein said received bits of serial data represent two dimensional sub band components of an image in the spatial frequency domain, differing sets of sub band components being decoded with differing decoding tables.

14. A serial data decoder as claimed in claim 11, wherein said state machine includes a memory with address locations within said memory corresponding to states of said state machine and for storing data for controlling the next address location to be read and state entered.

15. A serial data decoder as claimed in claim 14, wherein the next received bit of serial data is combined with data from a currently read address location to derive the next address location to be read.

16. A serial data decoder as claimed in claim 15, wherein said state machine includes a current decoding table counter for storing a table count value indicating which branching hierarchy and corresponding decoding table are to be used and for incrementing said table count value in response to said internal table selecting word, said table count value being combined with data from said currently read address location to derive the next address location to be read.

17. A serial data decoder as claimed in claim 11, wherein at least one of said plurality of branching hierarchies includes a state corresponding to an internal table selecting word for selecting a different branching hierarchy and corresponding decoding table for subsequent use from among said plurality of branching hierarchies.

18. A serial data decoder as claimed in claim 17, wherein said state machine includes a current decoding table counter for storing a table count value indicating which branching hierarchy and corresponding decoding table are to be used, the state machine serving to increment said table count value.

19. A serial data decoder as claimed in claim 17, wherein said transfer states are states corresponding to partial and full receipt of said internal table selecting word.

20. A serial data decoder as claimed in claim 11, wherein said state machine moves into one or more transfer states at the end of each data section to bring said data section up to a predetermined size.

21. A serial data encoder for generating a stream of encoded serial data from input data words having a plurality of data sections, said serial data encoder comprising:
 (i) means for applying a selectable one of a plurality of encoding tables to said input data words to produce encoded serial data;
 (ii) means for switching encoding tables between differing data sections; and
 (iii) means for inserting a sequence of bits of data into said encoded serial data between encoded versions of said data sections to produce the stream of encoded serial data, the sequences of bits of data for moving a state machine decoder during decoding of said encoded serial data into one or more unique transfer states prior to a complementary switching of decoding tables.

22. A method of serial data decoding for generating output data words according to a selectable one of a plurality of decoding tables from a stream of input data having a plurality of data sections to be decoded with differing decoding tables, said method comprising the steps of:
 (i) moving a state machine in response to received bits of serial data between states within a selectable one of a plurality of branching hierarchies of states, each branching hierarchy corresponding to one of said decoding tables and being such that each bit of said serial data controls which succeeding state is adopted until a state corresponding to an output data word is reached;
 (ii) moving said state machine into one or more transfer states after having received one of said data sections; and
 (iii) switching from a current branching hierarchy to a target branching hierarchy in response to an externally applied switching signal, said one or more transfer states being distinct from any states corresponding to an output data word and all possible states within said target branching hierarchy.

* * * * *